United States Patent
Frougier et al.

(10) Patent No.: US 11,374,167 B2
(45) Date of Patent: Jun. 28, 2022

(54) REDUCING PARASITIC BOTTOM ELECTRODE RESISTANCE OF EMBEDDED MRAM

(71) Applicant: International Business Machines Corporation, Armonk, NY (US)

(72) Inventors: Julien Frougier, Albany, NY (US); Ruilong Xie, Niskayuna, NY (US); Alexander Reznicek, Troy, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 16/809,916

(22) Filed: Mar. 5, 2020

(65) Prior Publication Data
US 2021/0280776 A1    Sep. 9, 2021

(51) Int. Cl.
*H01L 43/08*    (2006.01)
*H01L 27/22*    (2006.01)
*H01L 43/12*    (2006.01)
*H01L 43/02*    (2006.01)

(52) U.S. Cl.
CPC ............ *H01L 43/08* (2013.01); *H01L 27/222* (2013.01); *H01L 43/02* (2013.01); *H01L 43/12* (2013.01)

(58) Field of Classification Search
CPC ....... H01L 43/08; H01L 27/222; H01L 43/02; H01L 43/12
USPC .......................................................... 257/421
See application file for complete search history.

(56) References Cited

U.S. PATENT DOCUMENTS

| 9,164,555 | B2 | 10/2015 | Soffer | |
|---|---|---|---|---|
| 9,373,782 | B2 | 6/2016 | Li | |
| 9,548,333 | B2 | 1/2017 | Lu | |
| 2016/0380183 | A1* | 12/2016 | Chuang | H01L 43/12 257/421 |
| 2018/0158867 | A1* | 6/2018 | Kim | H01L 43/12 |
| 2018/0366638 | A1* | 12/2018 | Lin | H01L 43/12 |
| 2018/0374895 | A1* | 12/2018 | Hsu | H01L 23/5226 |
| 2019/0088864 | A1* | 3/2019 | Cho | H01L 27/224 |
| 2019/0109277 | A1 | 4/2019 | Jan | |
| 2019/0189910 | A1 | 6/2019 | Patel | |
| 2020/0006638 | A1* | 1/2020 | Chen | H01L 43/08 |
| 2020/0295256 | A1* | 9/2020 | Hashemi | H01L 43/08 |

FOREIGN PATENT DOCUMENTS

| EP | 1438774 B1 | 2/2010 |
|---|---|---|
| KR | 101523391 B1 | 5/2015 |

* cited by examiner

*Primary Examiner* — Jami Valentine Miller
(74) *Attorney, Agent, or Firm* — Alexander G. Jochym

(57) ABSTRACT

An embedded magnetoresistive random-access memory (MRAM) device including a portion of a metal wiring layer above a semiconductor device and a bottom electrode over the portion of the metal wiring layer. The embedded MRAM where the bottom electrode connects to a first portion of a bottom surface of a magnetoresistive random access memory pillar and a sidewall spacer is on the magnetoresistive random access memory pillar. The embedded MRAM device includes a ring of inner metal is on the portion of the metal wiring layer surrounding a portion of the bottom electrode.

20 Claims, 15 Drawing Sheets

REDUCING PARASITIC BOTTOM ELECTRODE RESISTANCE OF EMBEDDED MRAM

BACKGROUND OF THE INVENTION

The present invention relates generally to the field of semiconductor memory device technology and more particularly to magnetoresistive random-access memory devices.

Magnetoresistive Random Access Memory (MRAM), based on the integration of silicon based complementary silicon-oxide semiconductor (CMOS) with magnetic tunnel junction (MTJ) technology, is now a proven non-volatile memory technology with many advantages in terms of writing/read speed, power consumption, and lifetime over other commercialized memory types including SRAM, DRAM, Flash, etc. Conventional MRAM devices include a magnetic tunnel junction (MTJ) structure having magnetic (e.g., ferromagnetic) layers separated by an intermediary non-magnetic tunnel barrier layer. MRAM devices are commonly fabricated with one or more other semiconductor devices, such as field effect transistors (FET).

Minimizing parasitic series resistance is important to optimize the performance of embedded MRAM devices. High parasitic resistance can reduce the effective tunnel magnetoresistance (TMR) of bitcells. A reduction of the bitcell TMR leads to a reduction of the read performance and the read margin therefore increasing the read error rate and degrading the overall MRAM bitcell performance.

SUMMARY

Embodiments of the present invention provide an embedded magnetoresistive random-access memory (MRAM) device on a portion of a metal wiring layer above a transistor. The embedded MRAM device includes a bottom electrode over the portion of the metal wiring layer. The bottom electrode connects to a first portion of a bottom surface of a magnetoresistive random access memory pillar and a sidewall spacer is on the magnetoresistive random access memory pillar. The embedded MRAM device includes a ring of inner metal surrounding a portion of the bottom electrode is on the portion of the metal wiring layer.

Embodiments of the present invention provide a method of forming an embedded magnetoresistive random-access memory (MRAM) device, the method includes depositing a sacrificial layer over a first interlayer dielectric and a portion of a metal wiring layer over a transistor. The method of forming the MRAM device includes depositing a dielectric layer over a top surface of the sacrificial layer and forming a bottom metal electrode over the portion of the metal layer in the transistor. Furthermore, the method includes depositing a magnetic tunnel junction (MTJ) stack covered by a hardmask and etching a portion of the MTJ stack, a portion of the hardmask, a portion of the dielectric layer, and a portion of the sacrificial layer. The method of forming the MRAM device also includes forming a sidewall spacer on the MTJ stack, on a remaining portion of the dielectric layer, and on a remaining portion of the sacrificial layer. Additionally, the method includes removing the remaining portion of the sacrificial layer. The method of forming the MRAM device includes depositing an inner metal over the portion of the metal layer in the transistor, over the side of the bottom metal electrode, and over the exposed bottom surface of the dielectric layer. The method of forming the MRAM device includes selectively etching exposed portions of the inner metal to form a ring of inner metal around a portion of the bottom metal electrode.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
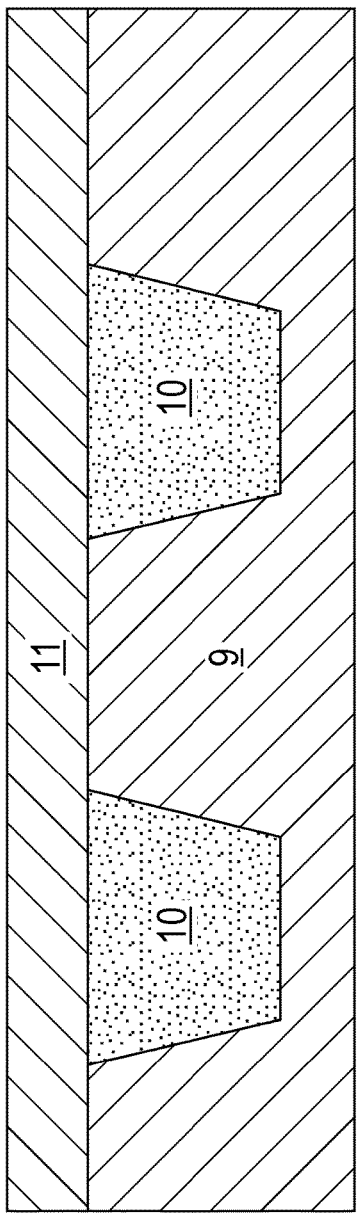
FIG. 1 is a cross-sectional view of a semiconductor structure after forming a sacrificial layer on an underlying semiconductor device in accordance with an embodiment of the present invention.

Embodiments of the present invention recognize that minimizing parasitic series resistance is important to optimizing embedded magnetoresistive random access memory (MRAM) device performance. Embodiments of the present invention recognize that high parasitic series resistance can reduce the effective tunnel magnetoresistance (TMR) in a magnetic tunnel junction (MTJ) at the bit cell level and, more specifically degrades the reading performance of the 1T-1R cell in the MRAM device. Embodiments of the present invention recognize that various components, such as, the field effect transistor (FET) resistance, the middle of the line (MOL) and backend of line (BEOL) stacks resistance, the bottom metal electrode resistance, and the bit line resistance contribute to the parasitic series resistance. Embodiments of the present invention recognize that one of the main contributors to the total resistance of the 1T-1R circuit is the bottom metal electrode, also known as the bottom metal electrode. Embodiments of the present invention recognize that the bottom metal electrode, is typically composed of tungsten. Embodiments of the present invention recognize that the bottom metal electrode can have a height of 20 to 50 nm and a diameter in the range of 20 to 40 nm. The small diameter of the bottom metal electrode can have an electrical resistance that is as high as the entire MOL and/or BEOL stacks resistance. Embodiments of the present invention recognize that increasing the bottom metal electrode diameter could reduce metal electrode resistance however, if the bottom metal electrode is exposed during MRAM stack etch during MRAM device formation metal back-sputtering from exposed bottom metal electrode may create shorts in the MRAM stack after etch (e.g., decreasing yield after etch and back-sputter). Embodiments of the present invention recognize that a method of decreasing parasitic series resistance in MRAM devices is desirable.

Embodiments of the present invention provide a method to reduce bottom electrode resistance and improve reading performance of one or more cells, such as, but not limited to the 1T-1R cell or 2T-1R cell, in various circuit architectures in an embedded MRAM device. Embodiments of the present invention provide a method of forming an embedded MRAM structure that reduces the bottom electrode resistance. Embodiments of the present invention provide a method of forming a bottom metal electrode with a larger diameter in a bottom portion of the bottom metal electrode in a MRAM device (e.g., forms a bottom metal electrode with a larger size). Embodiments of the present invention provide a bottom metal electrode with a larger diameter without back-sputtering of the metal during MTJ stack etch.

Embodiments of the present invention provide a method of forming the MRAM pillar on a layer of a dielectric material that is on a layer of a sacrificial material. The remaining portion of the dielectric layer protects the bottom electrode and prevents back-sputter of bottom electrode metal on the MRAM pillar during etch of the MTJ stack. Embodiments of the present invention etch away at least a portion of the sacrificial material while leaving a portion of the dielectric layer around the bottom metal electrode under the MRAM pillar. Embodiments of the present invention provide a method and a structure where an inner metal ring is deposited under the MRAM pillar surrounding a portion of the bottom electrode thereby, increasing the effective diameter of a portion of the bottom electrode. An addition of the inner metal as a ring around the bottom electrode effectively increases the diameter of the portion of the bottom electrode reducing the electrical resistance of the bottom electrode. Embodiments of the present invention present a method of forming a portion of the bottom electrode with a larger diameter to reduce resistance in the embedded MRAM device. Embodiments of the present invention provide a method of forming an embedded MRAM device with improved performance due to a reduction in bottom electrode resistance without exposing the bottom electrode metal to MTJ stack etch (e.g., the metal of the bottom metal electrode remains covered during MTJ stack etch to form the MRAM pillar).

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art, for magnetic tape heads, and only so much of the commonly practiced process steps are included as are necessary for an understanding of the described embodiments. The figures represent cross-section portions of an embedded MRAM device after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 is a cross-sectional view of semiconductor structure 100 after forming sacrificial layer 11 above an underlying semiconductor device in accordance with an embodiment of the present invention. In various embodiments, sacrificial layer 11 can be deposited on exposed surfaces of Mx 10 and exposed portions of ILD 9 of an underlying semiconductor device. Mx 10 can be a portion of a metal layer formed in a front-end of the line (FEOL), MOL or BEOL process of semiconductor manufacture. The portion of Mx 10, depicted in FIG. 1, can be above a portion of a semiconductor device. In some embodiments, the portion of Mx 10 is one of one a metal contact to the underlying semiconductor device or Mx 10 is on a source/drain or electrode of the underlying semiconductor device. The underlying semiconductor device may be a metal-oxide-semiconductor field-effect transistor (MOSFET) device, or CMOS device based on various architectures such as a planar-FET, FinFET, horizontal Gate-All-Around (h-GAA) FET or vertical Gate-All-Around (v-GAA) FET but is not limited to these semiconductor devices. Mx 10 may be composed of known metal materials, such as, but not limited to tungsten, copper, cobalt, or ruthenium, used in metal layers in a semiconductor structure (e.g., M1 metal layer, M2 metal layer, etc.). ILD 9 may be composed of any known ILD material, such as, $SiO_2$ or other dielectric material.

In various embodiments, sacrificial layer 11 is any material suitable for a sacrificial material in MRAM device fabrication. For example, sacrificial layer can be amorphous silicon, amorphous silicon germanium, a silicon oxide, a dielectric material, or an organic material. Sacrificial layer 11 can be deposited with plasma vapor deposition (PVD) or other known deposition method. In various embodiments, the thickness of sacrificial layer 11 is in the range of 10 to 30 nm. In some embodiments, the thickness of sacrificial layer 11 is less than 10 nm or greater than 30 nm.

Figure 2:
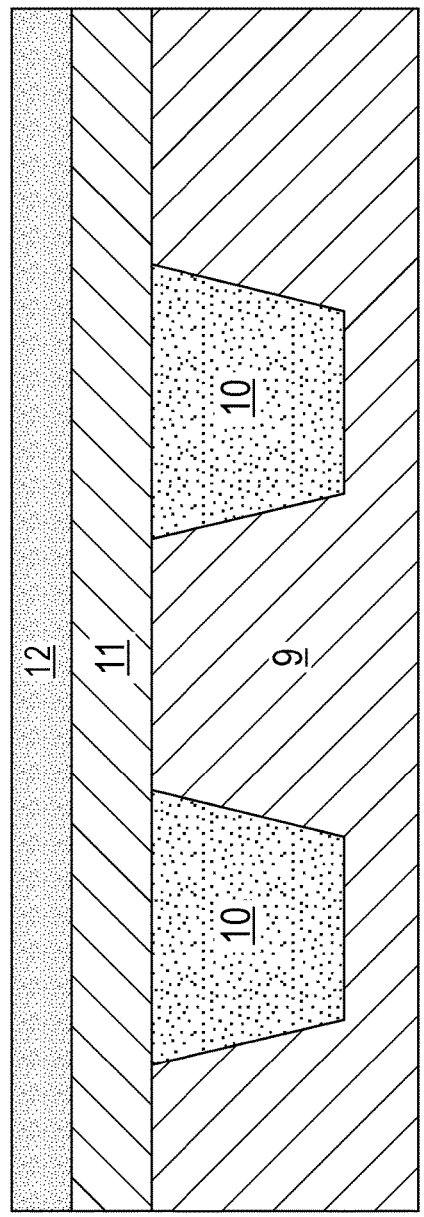
FIG. 2 is a cross-sectional view of the semiconductor structure after depositing a dielectric layer on the sacrificial layer in accordance with an embodiment of the present invention.

FIG. 2 is a cross-sectional view of semiconductor structure 200 after depositing dielectric layer 12 on sacrificial layer 11 in accordance with an embodiment of the present invention. Dielectric layer 12 can be any dielectric material used in semiconductor fabrication. For example, dielectric layer 12 may be composed of SiO, SiN, SiOC, SiON, SiOCN, SiBCN, or other low-k dielectric material that may be deposited with any known dielectric material deposition method. In various embodiments, dielectric layer 12 thickness is in the range of 10 to 30 nm. In some embodiments, dielectric layer thickness is less than 10 nm or greater than 30 nm.

Figure 3:
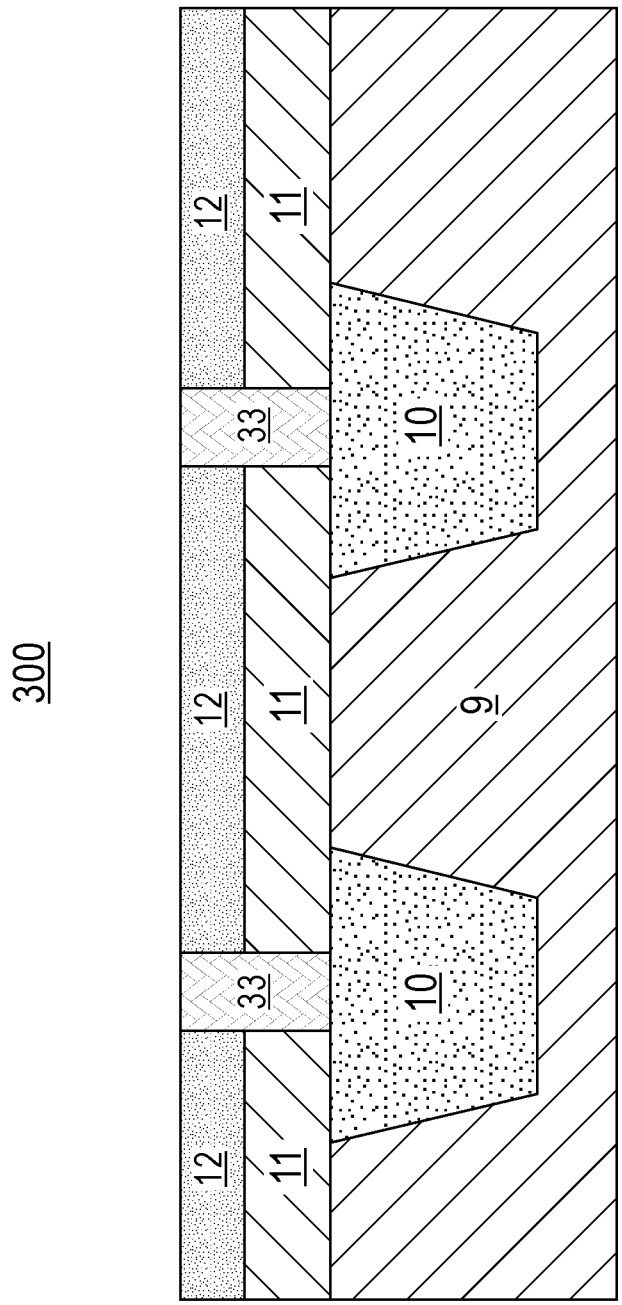
FIG. 3 is a cross-sectional view of the semiconductor structure after forming one or more bottom electrodes in accordance with an embodiment of the present invention.

FIG. 3 is a cross-sectional view of semiconductor structure 300 after forming bottom electrode 33 in accordance with an embodiment of the present invention. Patterning of dielectric layer 12, using known photolithography processes, can occur prior to an etch of portions of dielectric layer 12. In various embodiments, a selective etch of portions of dielectric layer 12 and sacrificial layer 11 over a portion of each Mx 10 occurs to form recesses for electrode formation. In various embodiments, a layer of a bottom electrode material is deposited over semiconductor structure 300 including in the formed recesses of dielectric layer 12 and sacrificial layer 11 using known electrode material deposition methods. The bottom electrode material can be any known electrode material used in MRAMs, such as, TaN, TiN, tungsten, or a combination of these. The bottom electrode material deposited in each recess fills bottom electrode 33. A chemical-mechanical polish (CMP) can be performed on the top surface of the deposited bottom electrode material. The CMP stops when the top surface of dielectric layer 12 is reached. After completing CMP, bottom electrode 33 is over a portion of each of Mx 10. In various embodiments, a width of bottom electrode 33 is in the range of 9 to 40 nm. In some embodiments, bottom electrode width is less than 9 nm or greater than 40 nm.

Figure 4:
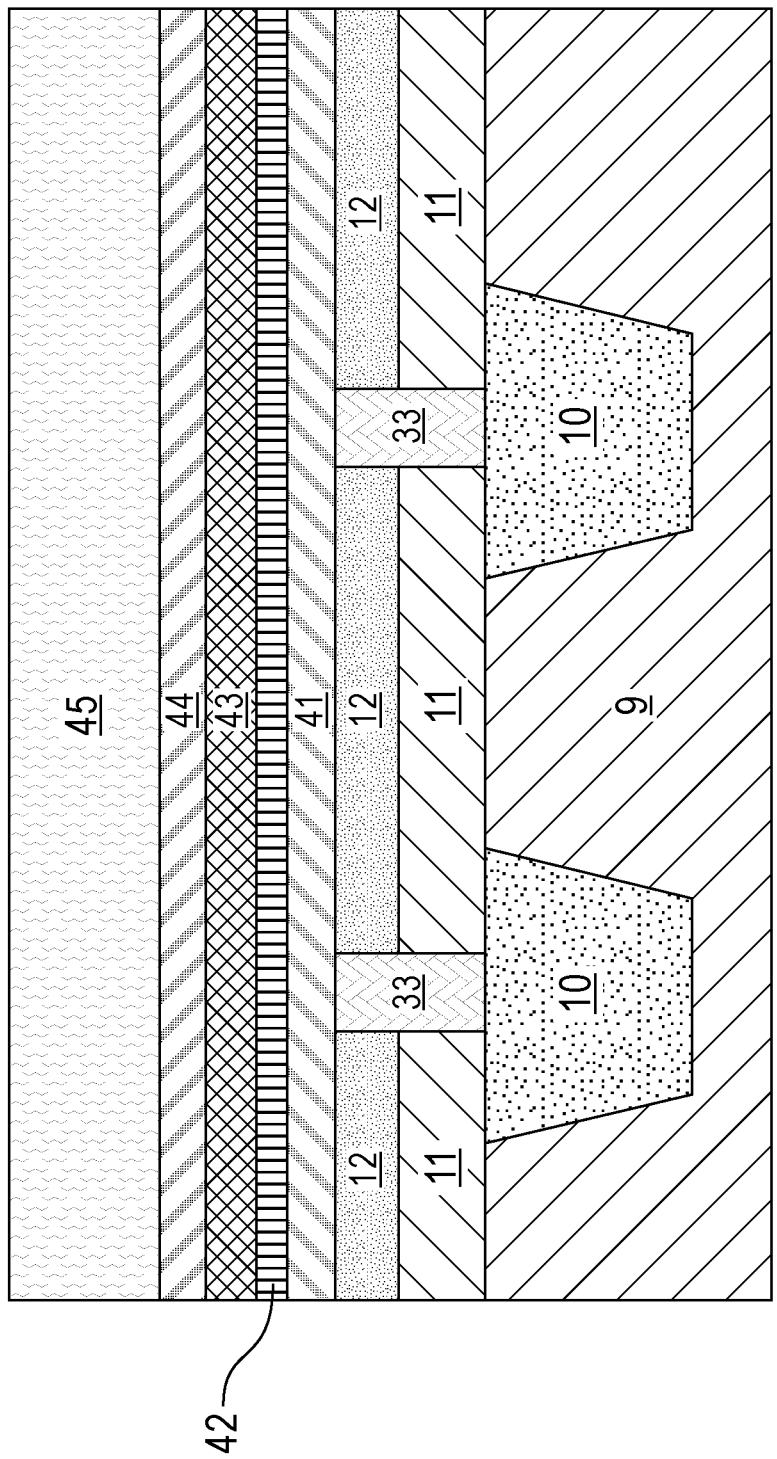
FIG. 4 is a cross-sectional view of the semiconductor structure after depositing a magnetic tunnel junction (MTJ) stack on the semiconductor structure in accordance with an embodiment of the present invention.

FIG. 4 is a cross-sectional view of semiconductor structure 400 after depositing a magnetic tunnel junction (MTJ) stack on semiconductor structure 400 in accordance with an embodiment of the present invention. As depicted in FIG. 4, the MTJ stack may be composed of reference layer 41, tunneling barrier layer 42, free layer 43, and capping layer 44. In various embodiments, reference layer 41 is deposited over the top surface of dielectric layer 12 and over bottom electrode 33. In some embodiments, capping layer 44 forms a top electrode. Using conventional MRAM materials and processes, each of the plurality of layers of MTJ materials commonly used in an MRAM device are deposited sequentially over semiconductor structure 400. Hardmask 45 can be deposited over capping layer 44. Each layer of the MTJ stack may have a thickness less than an angstrom to a thickness of several angstroms but, is not limited to these thicknesses. Examples of typical materials in the MTJ stack can include but, are not limited to, CoFeB for free layer 43, MgO for tunneling barrier layer 42, TaN for hardmask 45, TaN, TiN or tungsten for capping layer 44, and a plurality of layers of different ferromagnetic, antiferromagnetic and non-magnetic materials in reference layer 41. In various embodiments, a portion of reference layer 41 is a portion of a bottom surface of the MTJ stack (e.g., can be a portion of a bottom surface of the MRAM pillar formed from the MTJ stack). MTJ stack is not limited to the layers depicted in FIG. 4 but, in some embodiments, MJT stack includes other additional layers. While depicted as a single MTJ stack, as known to one skilled in the art, in various embodiments, many MTF stacks can be deposited sequentially over each other during formation of a MRAM device.

Figure 5:
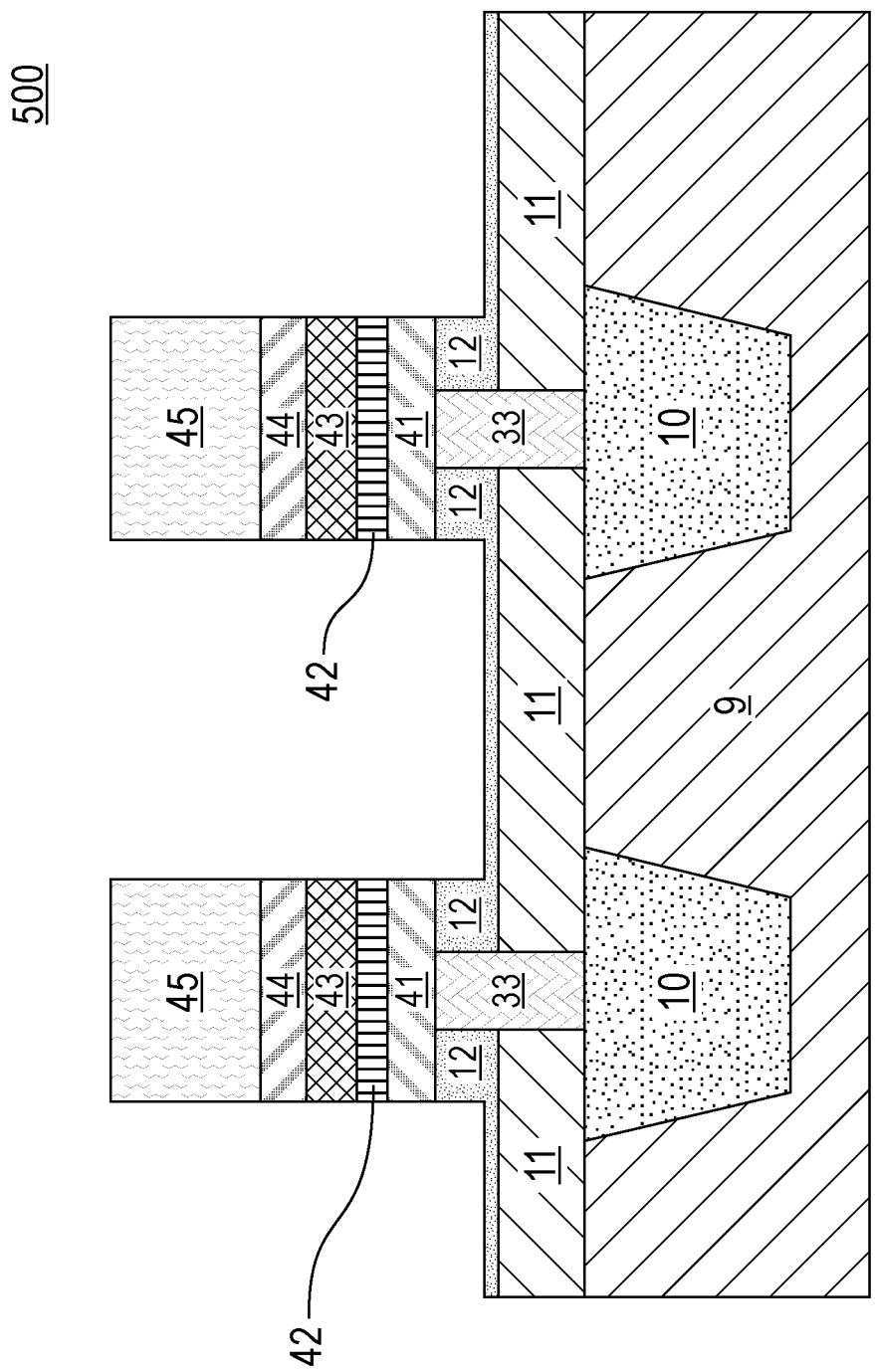
FIG. 5 is a cross-sectional view of the semiconductor structure after etching the MTJ stack to form a magnetoresistive random access memory (MRAM) pillar in the semiconductor substructure in accordance with an embodiment of the present invention.

FIG. 5 is a cross-sectional view of semiconductor structure 500 after etching the MTJ stack to form a MRAM pillar in semiconductor substructure 500 in accordance with an embodiment of the present invention. In various embodiments, an anisotropic etch is performed on select areas of the MTJ stack and portions of dielectric layer 12. For example, using photolithography patterning, one of an ion beam etch (IBE), a reactive ion etch (RIE), or a hybrid IBE/RIE of portions of the MTJ stack and a portion of dielectric layer 12 occurs. The IBE removes portions of hardmask 45, capping layer 44, free layer 43, tunneling barrier layer 42, reference layer 41 and dielectric layer 12 to form one or more MRAM pillars. As depicted in FIG. 5, bottom electrode 33 is encased by sacrificial layer 11 and dielectric layer 12 and is not subject to IBE (e.g., no electrode metal back sputtering on MRAM pillars). In various embodiments, after anisotropic etch, a width of the MRAM pillar is 10 to 80 nm but, is not limited to these widths. In various embodiments, a thickness of the remaining portion of dielectric layer 12 not under the MRAM pillar (e.g., not under reference layer 41) is 5 to 20 nm. In various embodiments, an in-situ plasma clean of MRAM pillar sidewalls is performed after anisotropic etch.

Figure 6:
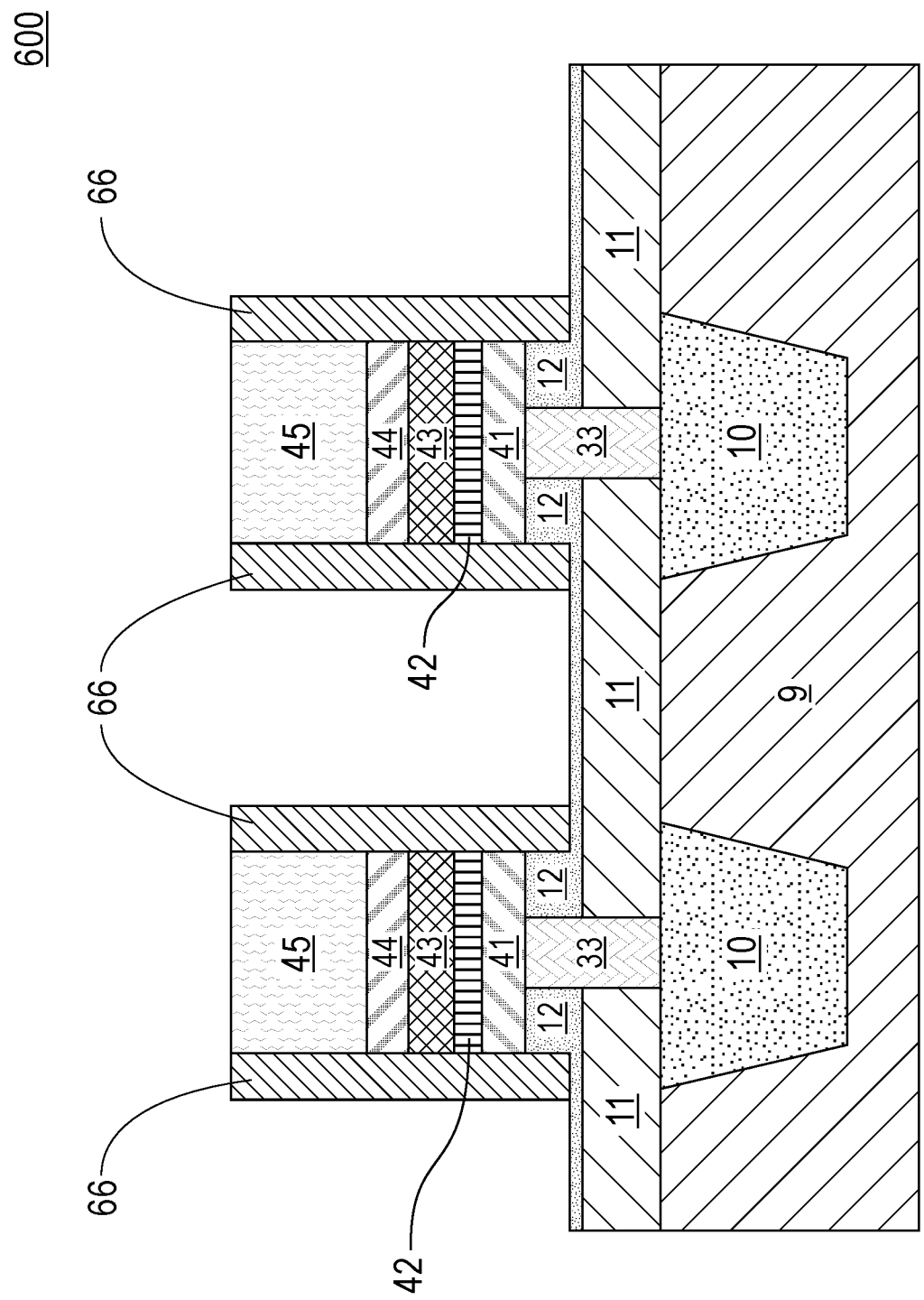
FIG. 6 is a cross-sectional view of the semiconductor structure after forming sidewall spacers on the MRAM pillars in accordance with an embodiment of the present invention.

FIG. 6 is a cross-sectional view of semiconductor structure 600 after forming sidewall spacers on the MRAM pillars in accordance with an embodiment of the present invention. Using known sidewall spacer materials and processes, sidewall spacer 66 is formed around the vertical sides of the MRAM pillar (e.g., on the side of hardmask 45, capping layer 44, free layer 43, tunneling barrier layer 42, and reference layer 41) and around exposed portions of dielectric layer 12. For example, sidewall spacer 66 may be deposited as a conformal layer. Sidewall spacer 66 may be composed a dielectric material, such as SiN, $SiO_2$, or any material suitable for forming a spacer in a MRAM or FET device. Using a wet or dry isotropic etch or a dry anisotropic etch process, such as a reactive ion etch (RIE) removes exposed portions of dielectric layer 12 from horizontal surfaces. Sidewall spacer 66 may be formed on the sides of the remaining portion of dielectric layer 12 around each of the MRAM pillars.

Figure 7:
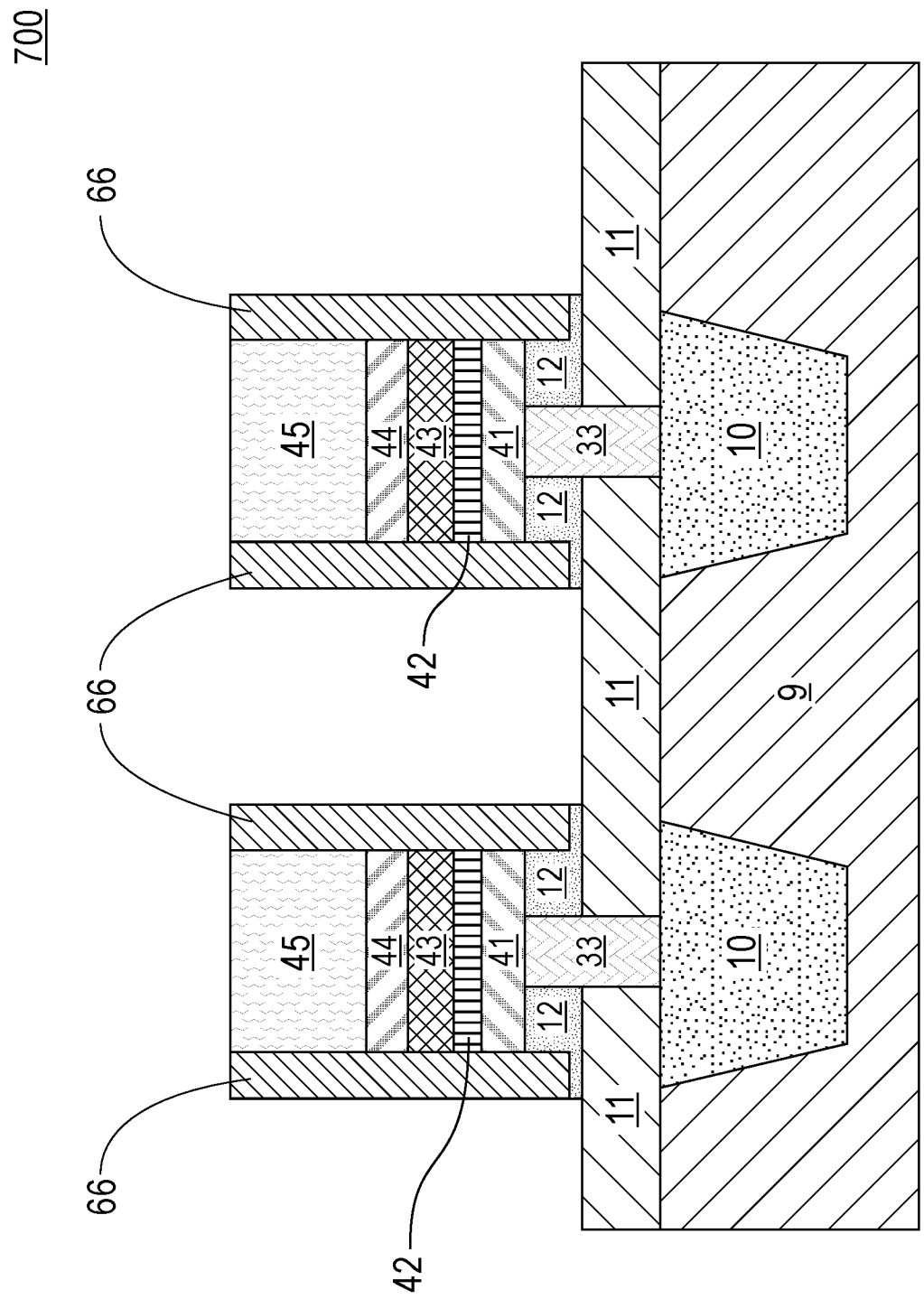
FIG. 7 is a cross-sectional view of the semiconductor structure after etching exposed portions of the dielectric layer on the semiconductor structure in accordance with an embodiment of the present invention.

FIG. 7 is a cross-sectional view of semiconductor structure 700 after etching exposed portions of dielectric layer 12 on semiconductor structure 700 in accordance with an embodiment of the present invention. Exposed portions of dielectric layer 12 remaining on top of sacrificial layer 11 are removed. For example, using a wet or dry isotropic etch or dry anisotropic etch, such as, a RIE etch, exposed portions of dielectric layer 12 are removed, leaving a portion of dielectric layer 12 under sidewall spacer 66 and under a portion of reference layer 41 below the bottom of each MRAM pillar.

Figure 8:
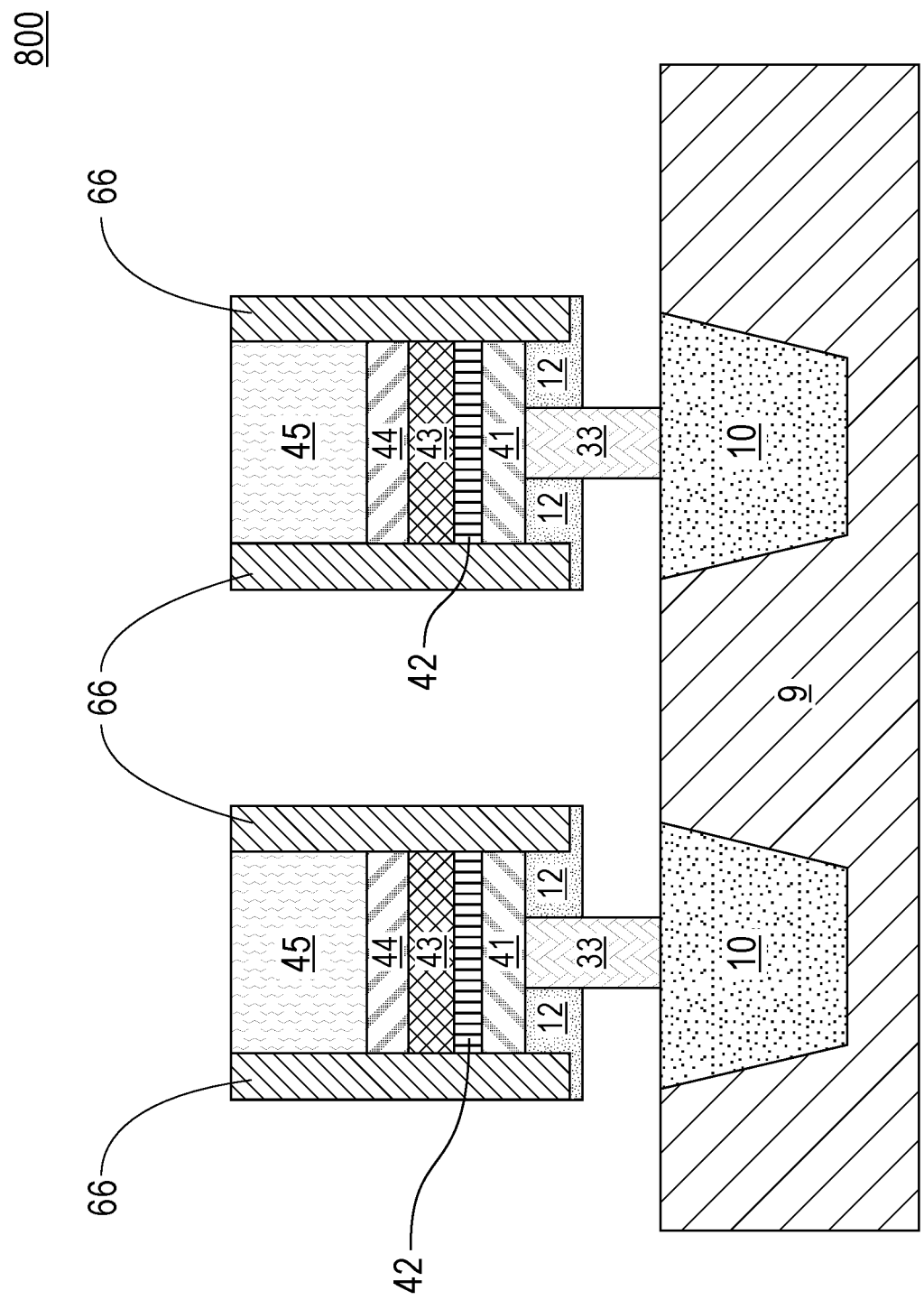
FIG. 8 is a cross-sectional view of the semiconductor structure after removing the sacrificial layer from the semiconductor structure in accordance with an embodiment of the present invention.

FIG. 8 is a cross-sectional view of semiconductor structure 800 after removing sacrificial layer 11 from the semiconductor structure 700 in accordance with an embodiment of the present invention. In various embodiments, sacrificial layer 11 is removed from semiconductor structure 700 using an isotropic etch. For example, a RIE etch or a wet etch can be used to remove sacrificial layer 11 from the top surface of ILD 9, from portions of the top surface Mx 10, and around bottom electrode 33 under dielectric layer 12.

Figure 9:
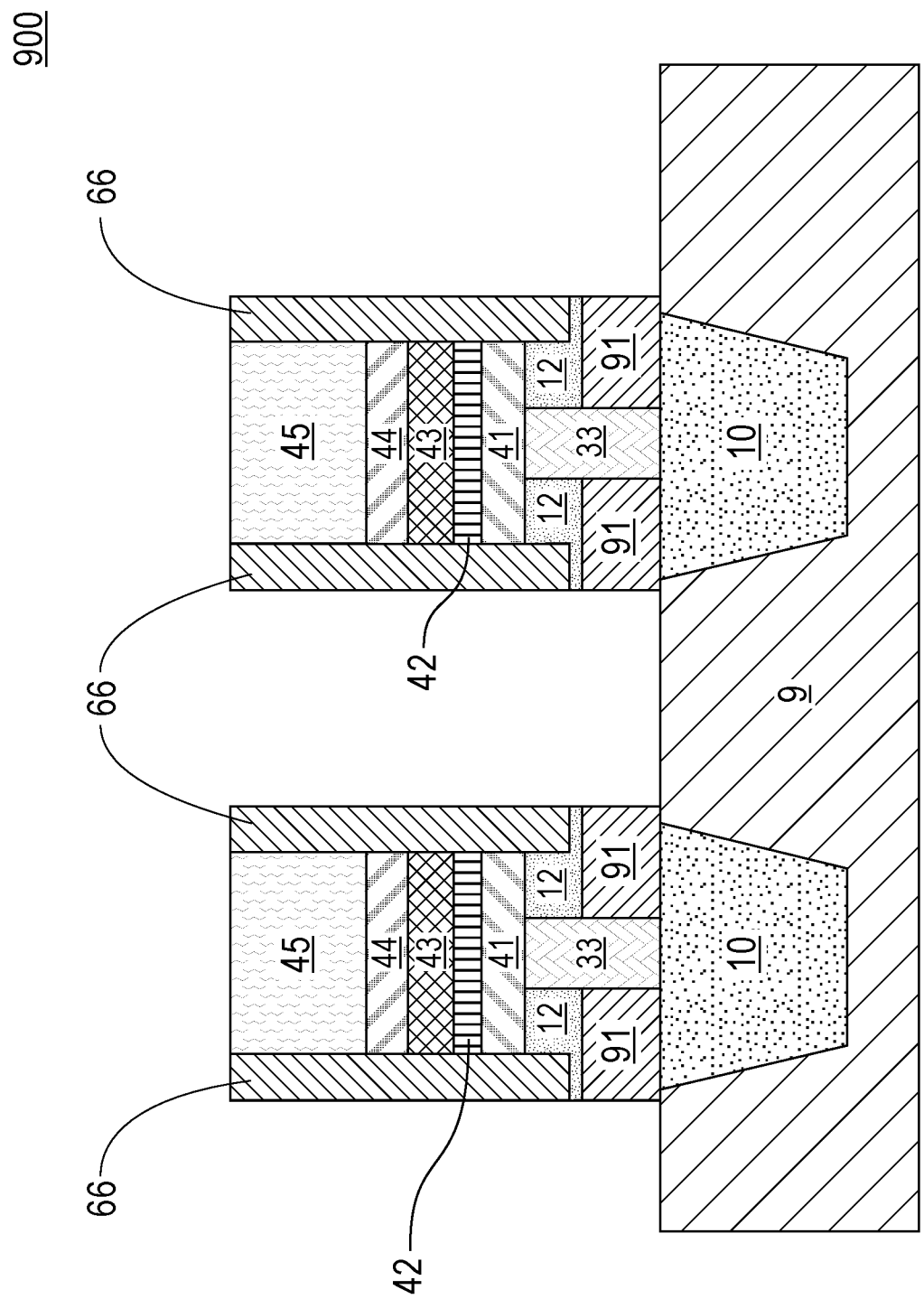
FIG. 9 is a cross-sectional view of the semiconductor structure after depositing an inner metal around the bottom electrodes of the semiconductor structure in accordance with an embodiment of the present invention.

FIG. 9 is a cross-sectional view of semiconductor structure 900 after forming inner metal 91 around each of bottom electrode 33 of semiconductor structure 900 in accordance with an embodiment of the present invention. In various embodiments, inner metal 91 is deposited around bottom electrode 33 on Mx 10 using a conformal deposition process. In an embodiment, inner metal 91 deposits on one of a portion of ILD 9 and Mx 10 or on a portion of Mx 10. Using a conformal deposition process, metal of inner metal 91 can deposit uniformly on the sides of bottom electrode 33, on Mx 10, and under dielectric layer 12. The conformal deposition process, such as atomic layer deposition (ALD) or chemical vapor deposition (CVD), deposits the spacer metal until the uniform deposition of the metal each of the side of bottom electrode 33, dielectric layer 12, and Mx 10 until the deposited metal pinches off the opening preventing further metal deposition. A selective isotropic etch back removes inner metal 91 from the exposed surfaces of semiconductor structure 900.

In various embodiments, a ring of inner metal 91 forms under dielectric layer 12 of the MRAM pillar. Inner metal 91 can be deposited around a bottom portion of bottom electrode 33. Inner metal 91 can be a metal, a transition metal, or an alloy. A thickness of inner metal 91 can be the same as the thickness of sacrificial layer 11 was as deposited. In various embodiments, inner metal 91 is composed of ruthenium or tungsten but is not limited to these metals. The ring of inner metal 91 surrounding the bottom of bottom electrode 33 can effectively increase a diameter of the bottom portion of bottom electrode 33 to improve electrical performance of the MRAM device (e.g., reduces parasitic series resistance of an embedded MRAM device).

Figure 10:
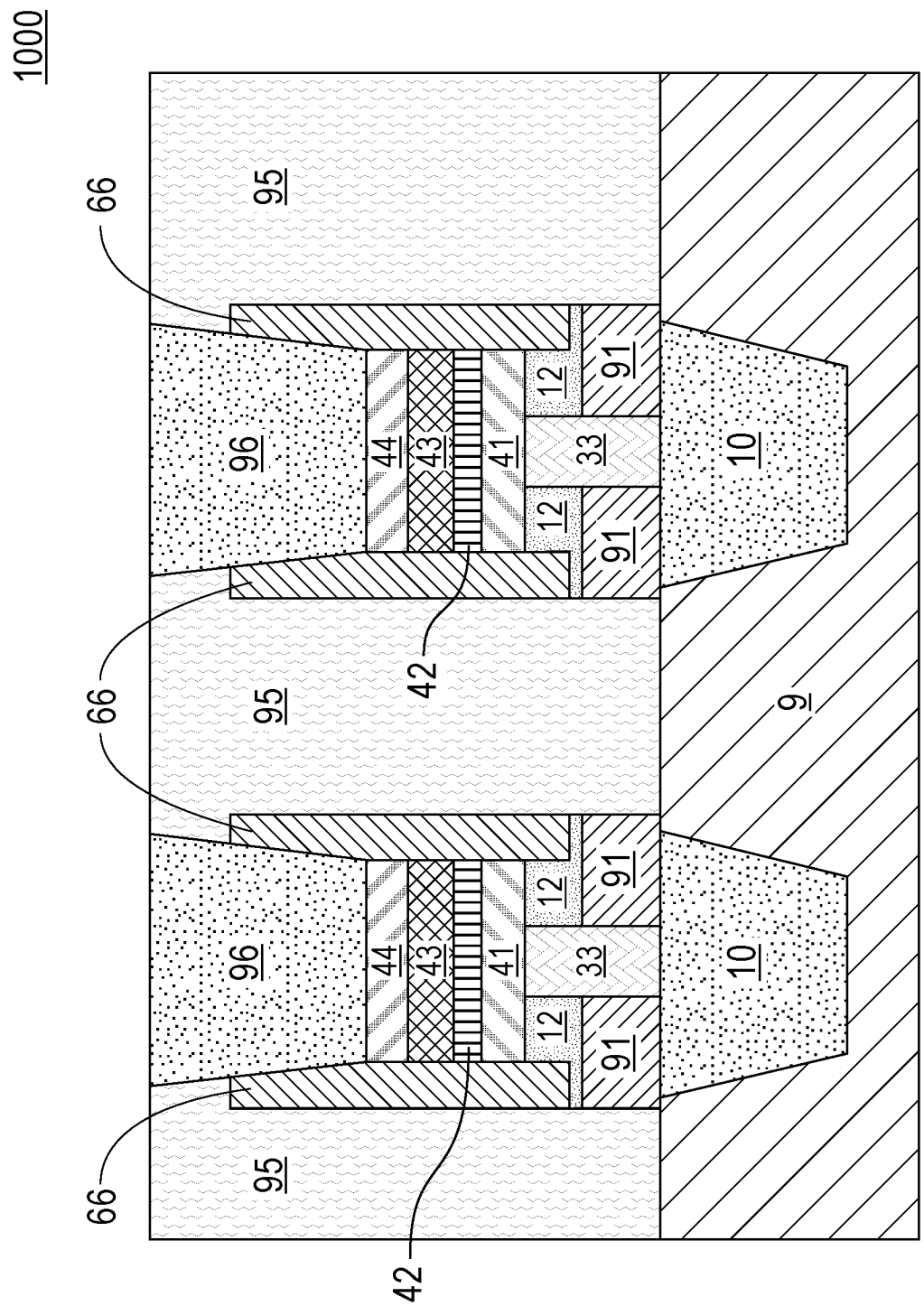
FIG. 10 is a cross-sectional view of the semiconductor structure after depositing interlayer dielectric (ILD) on the semiconductor structure and forming metal contacts in accordance with an embodiment of the present invention.

FIG. 10 is a cross-sectional view of semiconductor structure 1000 after depositing ILD 95 on semiconductor structure 1000 and forming contacts 96 in accordance with an embodiment of the present invention. Using known BEOL processes and materials, ILD 95 is deposited over semiconductor structure 1000. A selective etch removes portions of ILD 95, hardmask 45, and portions of sidewall spacer 66 exposing capping layer 44. For example, a layer of metal material for contacts 96 is deposited over semiconductor structure 1000 and a CMP may remove a top portion of the metal material over ILD 95 to leave contacts 96 and a portion of ILD 95. Contacts 96 may be composed of any known contact metal for a MRAM device (e.g., copper). In various embodiments, contacts 96 are a part of an Mx+1 layer of semiconductor structure 1000.

In various embodiments, semiconductor structure 1000 includes inner metal 91 surrounding a portion of bottom electrode 33 forming a footer or an extension of bottom electrode 33 (i.e., increases a diameter of a portion of bottom electrode. The combination of inner metal 91 and bottom electrode 33 provides a larger or bigger electrode with a larger diameter or larger effective diameter in a bottom portion of bottom electrode 33 that is surrounded by inner metal 91. Making a larger diameter of a portion of bottom electrode 33 using inner metal 91 as part of the electrode provides better electrical performance than bottom electrode 33 without inner metal 91. The combination of bottom electrode 33 and inner metal 91 in semiconductor structure 1000 decreases bottom metal electrode resistance in bottom electrode 33 and therefore, reduces the parasitic series resistance in the embedded MRAM (e.g., improves bit cell reading performance).

Figure 11:
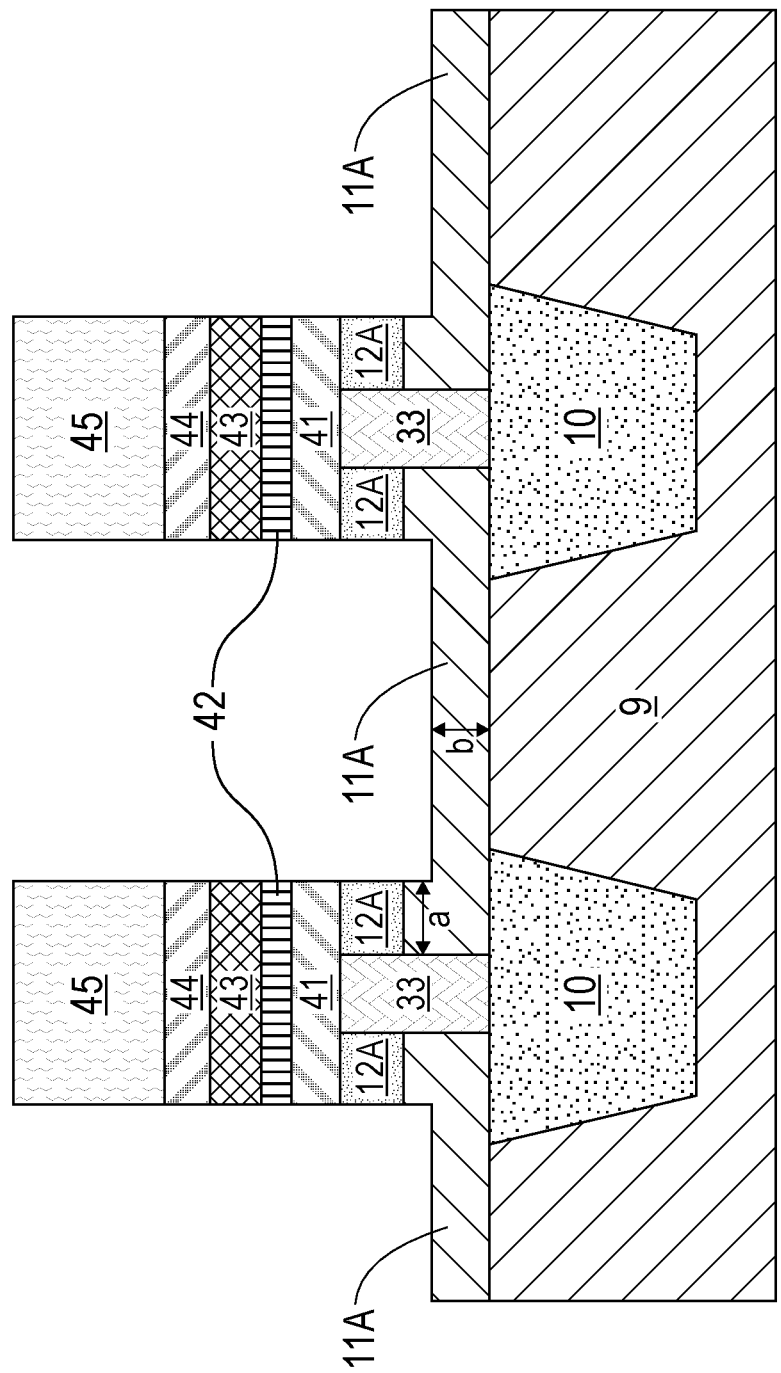
FIG. 11 is a cross-sectional view of the semiconductor structure after MRAM pillar formation in accordance with a second embodiment of the present invention.

FIG. 11 is a cross-sectional view of semiconductor structure 1100 after MRAM pillar formation in accordance with a second embodiment of the present invention. After the MTJ stack deposition in FIG. 4, in various embodiments, an anisotropic etch is performed on select areas of the MTJ stack, on portions of dielectric layer 12, and on portions of sacrificial layer 11. Semiconductor structure 1100 is formed with the same materials and basic processes as semiconductor structure 500 except that the anisotropic deeper etch is performed. In this embodiment, the etch of the MTJ stack goes down through dielectric layer 12 and through a portion of sacrificial layer 11. As previously discussed with reference to FIG. 5, the etch process may be an IBE, RIE, or a hybrid IBE/RIE process extending deeper into portions of semiconductor structure 1100. The portion of dielectric layer 12 in FIG. 5 is larger than the portion of dielectric layer 12 and therefore, in FIG. 11, the smaller portion of remaining material is labelled dielectric layer 12A. Similarly, the portion of sacrificial layer 11 in FIG. 5 is larger than the portion of sacrificial layer 11 in FIG. 11 and therefore, in FIG. 11, the smaller portion of remaining sacrificial material is labelled sacrificial layer 11A.

In semiconductor structure 1100, the deeper etch removes all of the selected, exposed portions of dielectric layer 12 leaving a remaining portion of dielectric layer 12 labeled as dielectric layer 12A (i.e., a smaller portion of dielectric layer 12 than remains in semiconductor structure 500). Dielectric layer 12A, as depicted, is under reference layer 41, abutting sidewall spacer 66A, and over a remaining portion of sacrificial layer 11A. In various embodiments, a thickness of the remaining portion of sacrificial layer 11A over ILD 9 is 5 to 20 nm. In various embodiments, after anisotropic etch, a width of the MRAM pillar is 10 to 80 nm. In various embodiments, the etch removes a portion of dielectric layer 12A above a remaining portion of sacrificial layer 11A and the remaining portion of sacrificial layer 11A is over ILD 9.

As depicted in FIG. 11, the width of the remaining portion of sacrificial layer 11A abutting or adjacent to dielectric layer 12A (i.e., between bottom electrode 33 and sidewall spacer 66A) is labelled "a" in FIG. 11 and a thickness of sacrificial layer 11A over ILD 9 is labelled "b." In various embodiments, a width "a" of sacrificial layer 12A is less than the thickness "b" of sacrificial layer 11A. For example, a range of width "a" of the remaining sacrificial layer 11A is 2.5 to 30 nm and a range of thickness "b" of the remaining sacrificial layer 11A is 10 to 40 nm. A resulting final semiconductor structure 1500 of the MRAM device formed from semiconductor structure 1100 when a<b is as depicted and discussed later with respect to FIG. 15.

In another embodiment, the width of the remaining portion of sacrificial layer 11A adjacent to dielectric layer 12A, depicted as "a" in FIG. 11, is more than the thickness of sacrificial layer 11A over ILD 9, depicted as "b" in FIG. 11. In this embodiment, the etch leaves a width "a" of the remaining portion of sacrificial layer 11A that is greater than a thickness "b" of the remaining sacrificial layer 11A over interlayer dielectric 9 (i.e., when a>b) results in final semiconductor structure 1600 of the MRAM device is as depicted and discussed in detail later with reference to FIG. 16.

Figure 12:
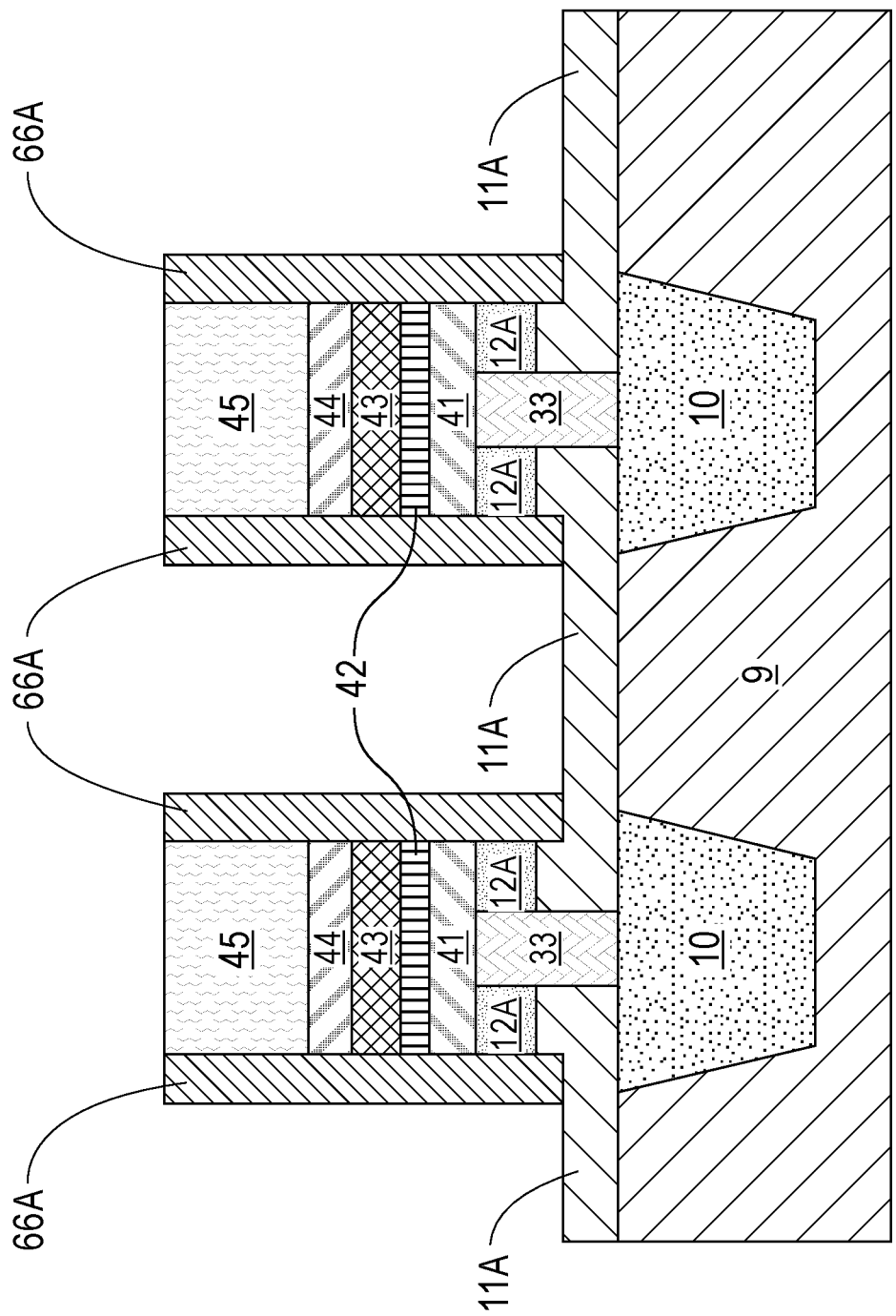
FIG. 12 is a cross-sectional view of a semiconductor structure after sidewall spacer formation on the MRAM pillars in accordance with the second embodiment of the present invention.

FIG. 12 is a cross-sectional view of semiconductor structure 1200 after sidewall spacer 66A formation on the MRAM pillars in accordance with the second embodiment of the present invention. Using known sidewall spacer formation processes as previously discussed with reference to FIG. 6, sidewall spacer 66A is deposited. As depicted in FIG. 11, sidewall spacer 66A is longer than sidewall spacer 66 in FIG. 5 due the deeper etch removing dielectric layer 12A and partially removing sacrificial layer 11A when forming the MRAM pillars. In various embodiments, sidewall spacer 66A is around the sides of MRAM pillar, around the remaining portion of dielectric layer 12A, and around the side of the remaining portion of sacrificial layer 11A. In various embodiments, an in-situ plasma clean of MRAM pillar sidewalls is performed after the anisotropic etch.

Figure 13:
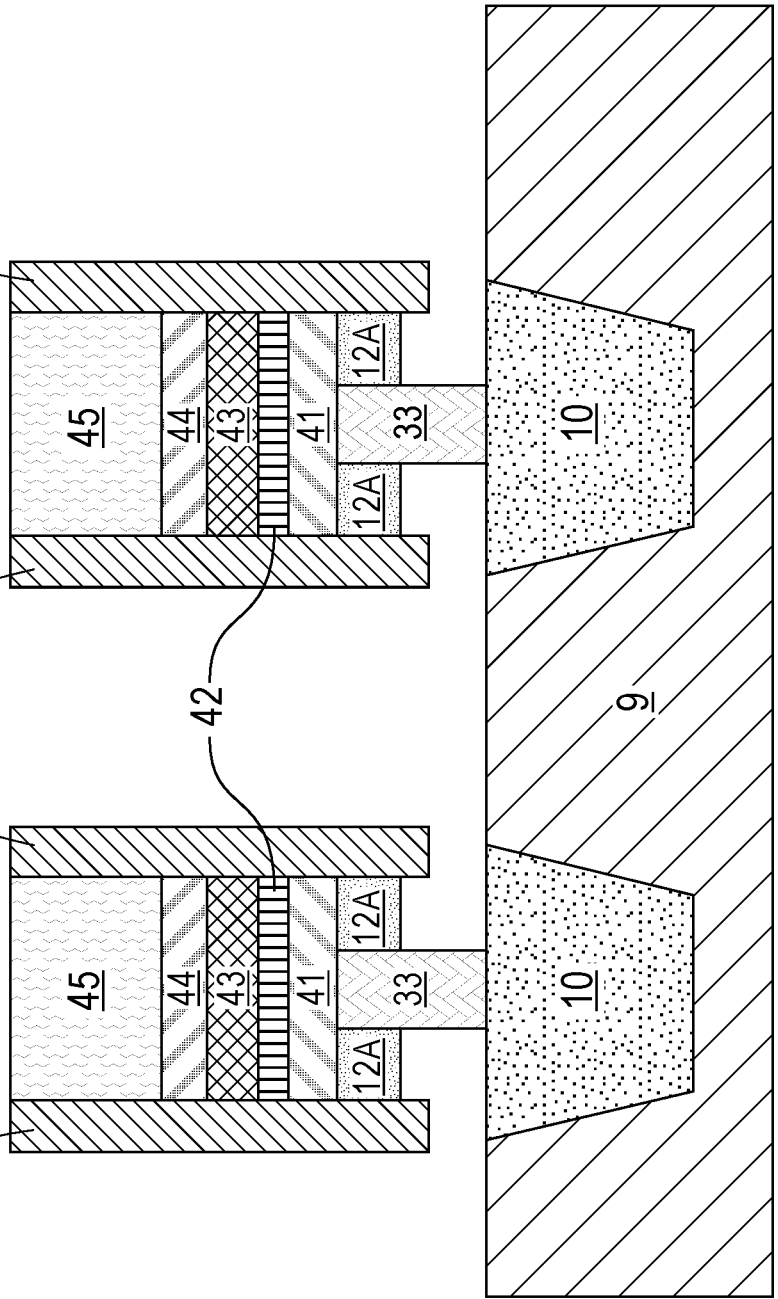
FIG. 13 is a cross-sectional view of the semiconductor structure after removing the sacrificial layer from the semiconductor structure in accordance with the second embodiment of the present invention.

FIG. 13 is a cross-sectional view of the semiconductor structure 1300 after removing sacrificial layer 11A from semiconductor structure 1300 in accordance with the second embodiment of the present invention. In various embodiments, sacrificial layer 11A is removed from semiconductor structure 700 using an isotropic etch. For example, a RIE etch or a wet etch can be used to remove sacrificial layer 11A from the top surface of ILD 9 and around bottom electrode 33 under the MRAM pillar (e.g., over Mx 10). Sacrificial layer 11A can be removed under dielectric layer 12A below the MRAM pillar and from under sidewall spacers 66A.

Figure 14:
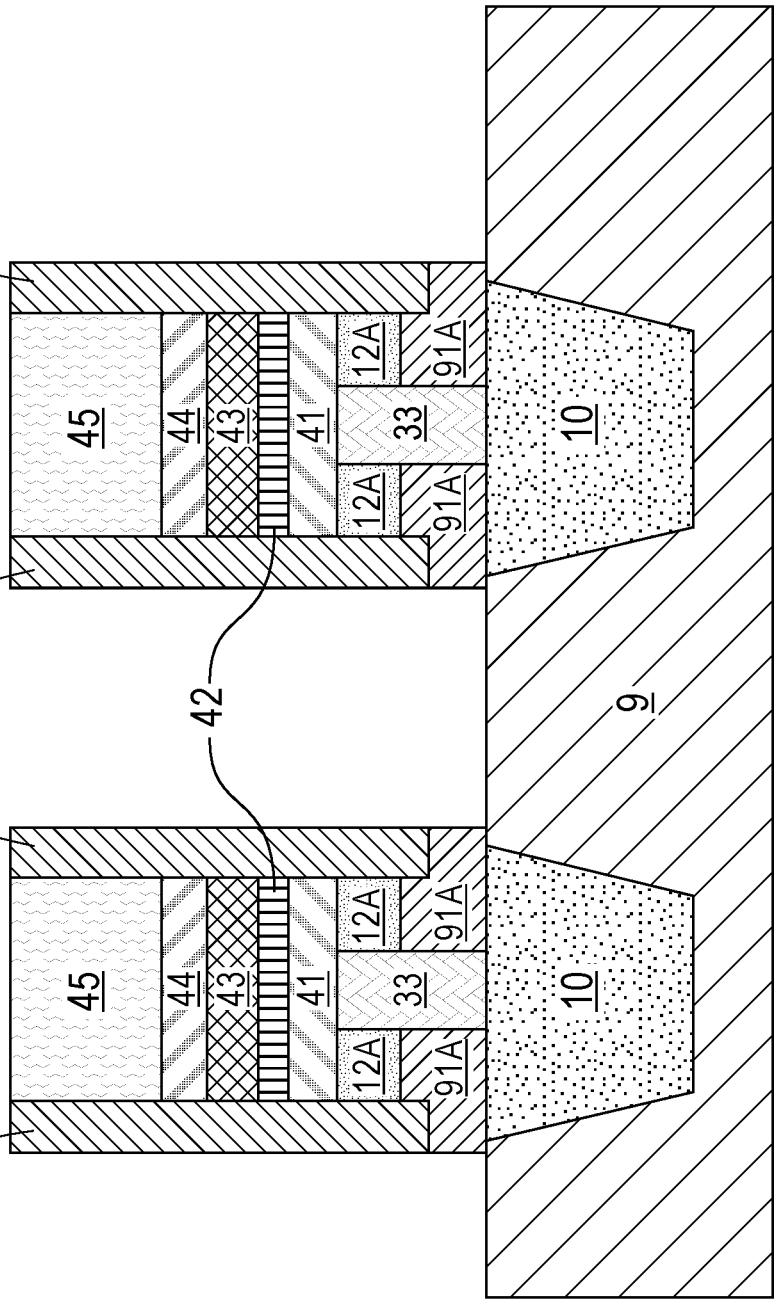
FIG. 14 is a cross-sectional view of the semiconductor structure after depositing an inner metal around the bottom electrode of the semiconductor structure in accordance with the second embodiment of the present invention.

FIG. 14 is a cross-sectional view of semiconductor structure 1400 after forming inner metal 91A around the bottom electrodes of the semiconductor structure in accordance with the second embodiment of the present invention. In various embodiments, inner metal 91A is deposited around bottom electrode 33 on Mx 10 using a conformal deposition process. In an embodiment, inner metal 91A covers Mx 10. In some embodiments, inner metal 91A deposits over Mx 10 and a portion of ILD 9 adjacent to Mx 10. In one embodiment, inner metal 91A covers a portion of Mx 10. An amount of Mx 10 and ILD 9 covered may depend on the dimensions of the MRAM pillar and the width of Mx 10. As discussed previously with reference to FIG. 9, a conformal deposition process such as atomic layer deposition (ALD) or chemical vapor deposition (CVD) uniformly deposits a metal for inner metal 91A. Inner metal 91A can be deposited around a bottom portion of bottom electrode 33 and under dielectric layer 12A and sidewall spacer 66A. A portion of inner metal 91A extends upward from the bottom of sidewall spacer 66A to dielectric layer 12A. As depicted in FIG. 14, inner metal 91A extends higher up on bottom electrode 33 and forms a larger inner metal 91A than inner metal 91 due to the deeper IBE in FIG. 11. In this embodiment, inner metal 91A deposits uniformly on the sides of bottom electrode 33, on Mx 10, under dielectric layer 12A, and under sidewall spacers 66A until the uniform deposition of the metal on side pinches off metal deposition. A selective isotropic etch back removes inner metal 91A from the exposed surfaces of semiconductor structure 1400.

In various embodiments, a solid metal ring of inner metal 91A forms under dielectric layer 12A when the thickness of inner metal 91A under sidewall spacer 66A is less than the width of inner metal 91A adjacent to dielectric layer 12A (i.e., between bottom electrode 33 and sidewall spacer 66A). In various embodiments, inner metal 91A is larger than inner metal 91 (e.g., due to the deeper IBE etch in FIG. 11).

Figure 15:
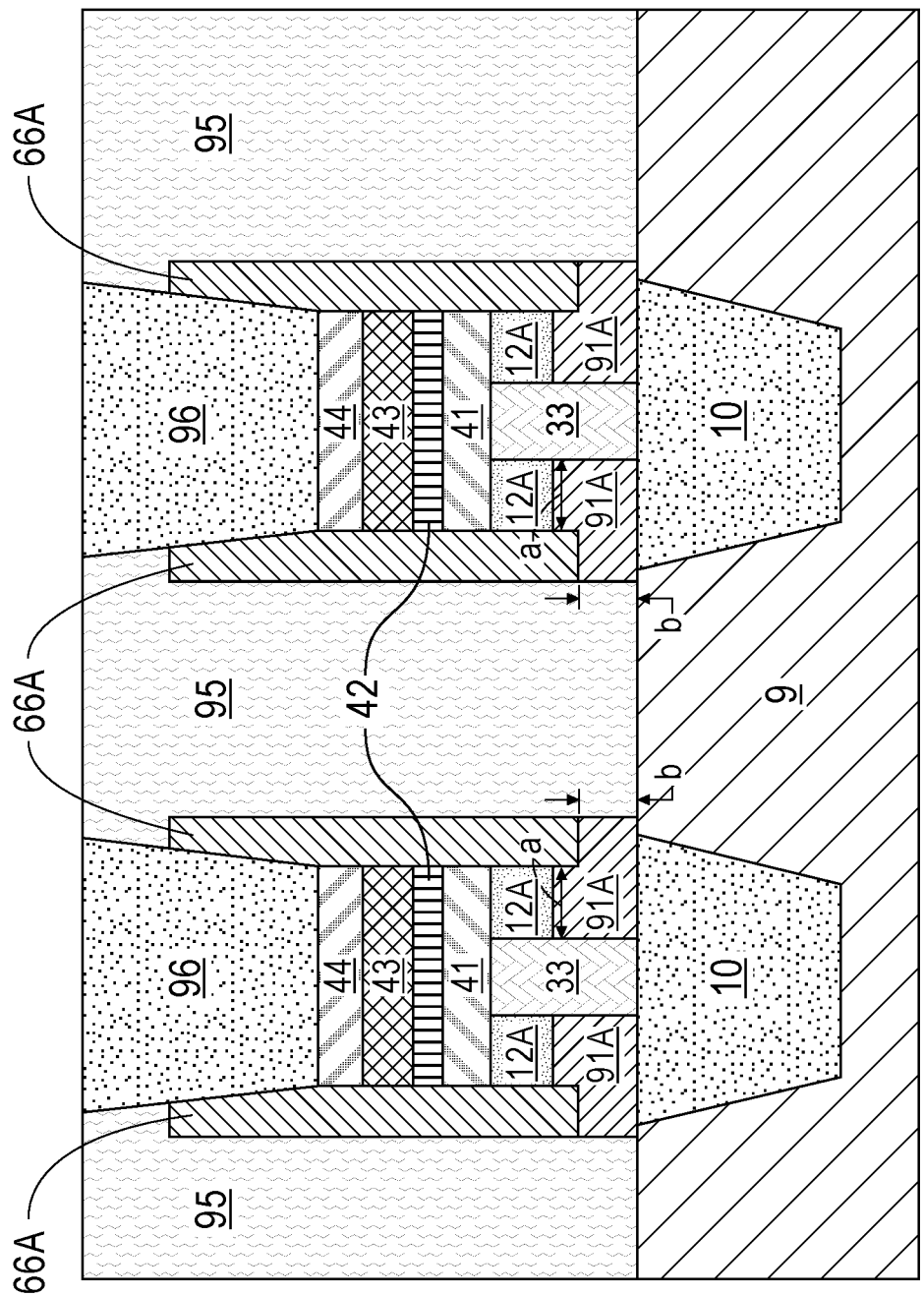
FIG. 15 is a cross-sectional view of the semiconductor structure after depositing interlayer dielectric (ILD) on the semiconductor structure and forming metal in the ILD in accordance with the second embodiment of the present invention.

FIG. 15 is a cross-sectional view of semiconductor structure 1500 after depositing interlayer dielectric (ILD) on the semiconductor structure and forming metal in the ILD in accordance with the second embodiment of the present invention. Using known BEOL or MOL processes and materials, as previously discussed with regard to FIG. 10, ILD 95 is deposited over semiconductor structure 1500. A selective etch removes portions of ILD 95, hardmask 45, and portions of sidewall spacer 66A exposing capping layer 44 and contacts 96 are deposited. A CMP may remove a top portion of the metal material and ILD 95 leaving contacts 96 and a portion of ILD 95.

In various embodiments, semiconductor structure 1500 includes inner metal 91A surrounding a portion of bottom electrode 33 to form a footer or an extension of bottom electrode 33. Inner metal 91A can be larger than inner metal 91 in FIG. 10 due to the deeper IBE etch in FIG. 11. The combination of inner metal 91A and bottom electrode 33 where inner metal 91A is around the bottom portion of bottom electrode 33 provides a larger or bigger effective size of bottom electrode 33 (e.g., both inner metal 91A and bottom electrode 33 conduct electrically and therefore, reduce the electrical resistance of bottom electrode 33). Inner metal 91A aides bottom electrode 33 in conducting electricity and/or signals and therefore, provides better electrical performance than bottom electrode 33 without inner metal 91A or bottom electrode 33 with inner metal 91 (e.g., a larger effective diameter of bottom electrode 33 reduces bottom electrode 33 resistance). In various embodiments, a width of inner metal 91A adjacent to dielectric layer 12A (i.e., depicted as "a" in FIG. 15) is less than a thickness of inner metal 91A under sidewall spacer 66A. When a width "a" is less than a thickness "b" under sidewall spacer 66A, then the conformal deposition of inner metal 91A can completely fill the space under the MRAM pillar and inner metal 91A forms a solid metal ring around bottom electrode 33.

Figure 16:
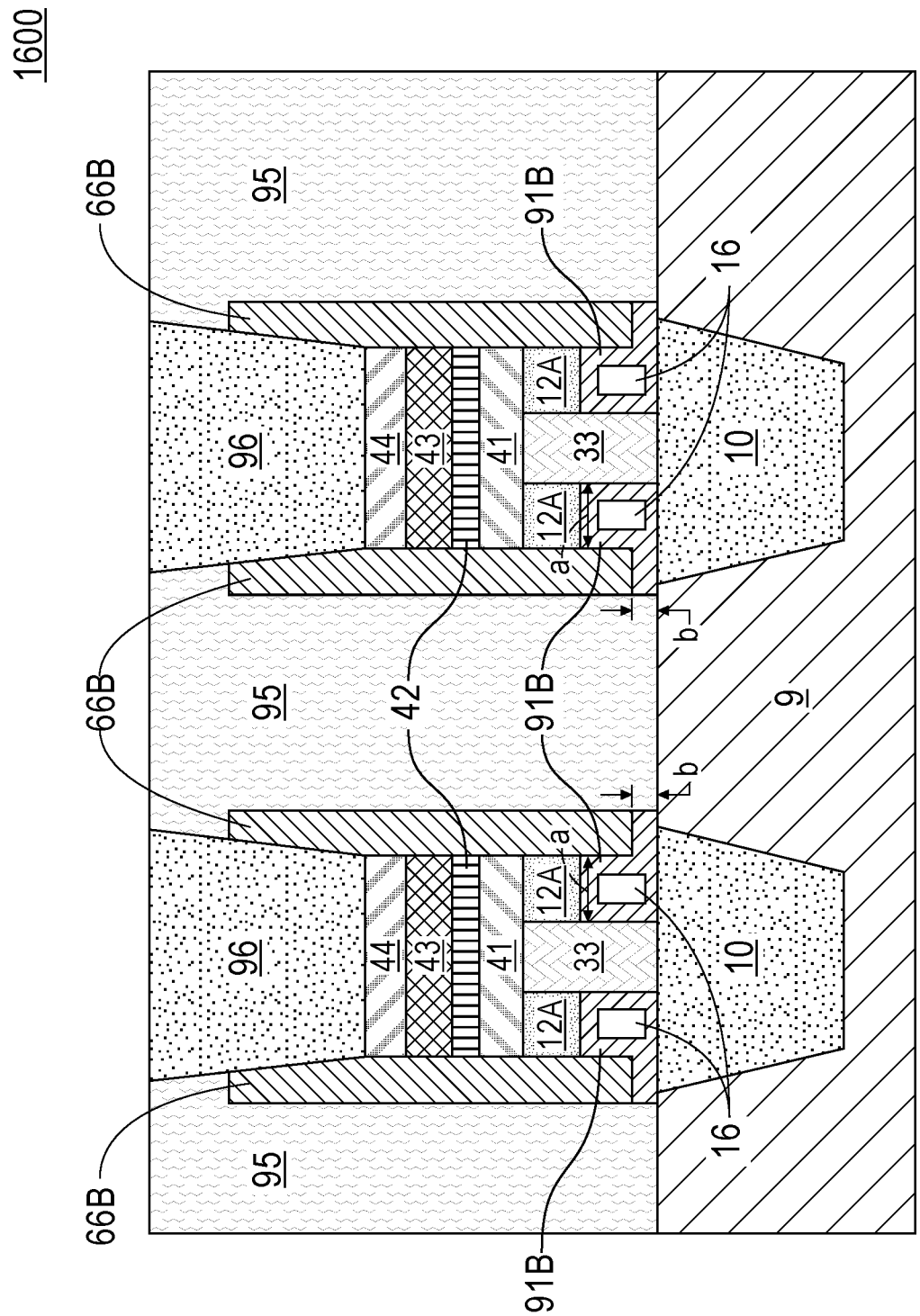
FIG. 16 is a cross-sectional view of a semiconductor structure after depositing interlayer dielectric (ILD) and contacts on the semiconductor structure when inner metal includes an encapsulated air gap in accordance with a third embodiment of the present invention.

FIG. 16 is a cross-sectional view of semiconductor structure 1600 after depositing ILD 95 and contacts 96 on semiconductor structure 1600 when inner metals 91B include encapsulated air gap 16 in accordance with a third embodiment of the present invention. In semiconductor structure 1600, a deeper IBE is performed during MRAM pillar formation than the IBE etch of semiconductor structure 1100. For example, more of the exposed surfaces of sacrificial layer 11A are removed resulting in longer sidewalls spacers 66B and thinner inner metals 91B under the longer sidewall spacers 66B. In various embodiments, as a result of these changes, when inner metal 91B is conformally deposited, an air gap is formed within a center portion of inner metal 91B. In various embodiments, a ring of air, such as air gap 16, is encapsulated in inner metal 91B. During conformal deposition of inner metal 91*b*, due to the reduced spacer under sidewall spacers 66B, the metal deposition pinches off before inner metal 91B is completely deposited into a solid ring around bottom electrode 33. In this case, inner metal 91B can be a tubular ring or hollow metal tube with a ring or circular of air gap 16 inside inner metal 91B. In various embodiments, air gap 16 in a central area of inner metal 91B forming a hollow tube inside inner metal 91B. Inner metal 91B can be a hollow metal tube with a ring of air gap 16 inside. Inner metal 91B can be considered an extension of bottom electrode 33. With inner metal 91B, bottom electrode 33 can provide better electrical performance than a bottom electrode without an additional metal ring (e.g., without an inner metal 91, 91A, or 91B). A larger metal volume around bottom electrode 33 provided by inner metal 91A can have less resistance than bottom electrode 33 without inner metal 91A under dielectric layer 12A (i.e., that is under the MRAM pillar).

As depicted in FIG. 16, to complete the MRAM structure, ILD 95 and contacts 96 are formed using known back end of the line (BEOL) processes and materials, as previously discussed with regard to FIG. 15.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An embedded magnetoresistive random-access memory (MRAM) device, comprising:
    a bottom electrode over a first portion of a metal wiring layer connects to a first portion of a bottom surface of a magnetoresistive random access memory pillar, wherein a sidewall spacer is on the magnetoresistive random access memory pillar;
    a dielectric layer under a second portion of the bottom surface of the magnetoresistive random access memory pillar and the sidewall spacer; and
    a ring of inner metal is on a second portion of the metal wiring layer around a portion of the bottom electrode.

2. The embedded MRAM device of claim 1, wherein the metal wiring layer is embedded in a first interlayer dielectric, wherein the metal layer is above a semiconductor device.

3. The embedded MRAM device of claim 1, further comprising:
    a second metal contact on the magnetoresistive random access memory pillar abuts a portion of a second interlayer dielectric material and a top portion of the sidewall spacer on the magnetoresistive random access memory pillar; and
    the second interlayer dielectric material is on the first interlayer dielectric surrounding a portion of the ring of inner metal, around the sidewall spacer on the magnetoresistive random access memory pillar, and around the second metal contact on the magnetoresistive random access memory pillar.

4. The embedded MRAM device of claim 1, wherein the ring of inner metal around the portion of the bottom electrode provides a reduction of an electrical resistance of the bottom electrode.

5. The embedded MRAM device of claim 1, wherein the ring of inner metal around the portion of the bottom electrode is around a bottom portion of sides of the bottom electrode increases an effective size of the bottom electrode.

6. The embedded MRAM device of claim 1, wherein a width of the bottom electrode over the first portion of the metal wiring layer is less than a width of the magnetoresistive random access memory pillar.

7. The embedded MRAM device of claim 1, wherein the ring of inner metal around the portion of the bottom electrode, further comprises:
    the ring of inner metal is under the dielectric layer;
    a first portion of the dielectric layer is under a second portion of the bottom surface of the magnetoresistive random access memory pillar and is surrounded by a bottom portion of the sidewall spacer on the magnetoresistive random access memory pillar that extends below the bottom surface of the magnetoresistive random access memory pillar; and
    a second portion of the dielectric layer is under the sidewall spacer on the magnetoresistive random access memory pillar.

8. The embedded MRAM device of claim 7, wherein the ring of inner metal around the portion of the bottom electrode is an extension of the bottom electrode that increases a diameter of a bottom portion of the bottom electrode.

9. An embedded magnetoresistive random-access memory (MRAM) device, comprising:
    a bottom electrode over a first portion of a metal wiring layer connects to a first portion of a bottom surface of a magnetoresistive random access memory pillar;
    a dielectric layer under a second portion of the bottom surface of the magnetoresistive random access memory pillar; and
    a ring of inner metal is around a bottom portion of the bottom electrode.

10. The embedded MRAM device of claim 9, wherein the ring of inner metal around the bottom portion of the bottom electrode increases an effective size of the bottom electrode.

11. The embedded MRAM device of claim 9, wherein the ring of inner metal around the bottom portion of the bottom electrode is on a second portion of the metal wiring layer.

12. The embedded MRAM device of claim 9, wherein the ring of inner metal is under the dielectric layer and under a bottom portion of a sidewall spacer on the magnetoresistive random access memory pillar that extends below the magnetoresistive random access memory pillar.

13. The embedded MRAM device of claim 12, wherein a thickness of the ring of inner metal under the bottom portion of the sidewall spacer is less than a width of the ring of inner metal under the dielectric layer.

14. The embedded MRAM device of claim 9, wherein the metal wiring layer is one of above a semiconductor device or connected to an underlying semiconductor device.

15. An embedded magnetoresistive random-access memory (MRAM) device, comprising:

a bottom electrode over a first portion of a metal wiring layer connects to a first portion of a bottom surface of a magnetoresistive random access memory pillar;
a dielectric layer under a second portion of the bottom surface of the magnetoresistive random access memory pillar; and
a ring of inner metal is around a bottom portion of the bottom electrode, wherein the ring of inner metal has an air gap inside a center portion of the ring of inner metal.

16. The embedded MRAM device of claim 15, wherein the air gap inside the center portion of the ring of inner metal forms a hollow tube around a bottom portion of the bottom electrode.

17. The embedded MRAM device of claim 15, further comprising:
a contact on the magnetoresistive random access memory pillar; and
a sidewall spacer surrounding a bottom portion of the top contact, surrounding the magnetoresistive random access memory pillar, the dielectric layer, and a top portion of the ring of inner metal.

18. The embedded MRAM device of claim 15, wherein the ring of inner metal is around the bottom portion of the bottom electrode, further comprises:
a first portion of a top surface of the ring of inner metal is under a second portion of the bottom surface of the magnetoresistive random access memory pillar; and
a second top portion of the top surface of the inner metal is under a sidewall spacer on the magnetoresistive random access memory pillar.

19. The embedded MRAM device of claim 15, wherein the metal wiring layer is one of above a semiconductor device or connected to an underlying semiconductor device.

20. The embedded MRAM device of claim 1, further comprising:
a top contact above the magnetoresistive random access memory pillar; and
a first interlayer dielectric around the metal wiring layer, wherein the metal layer is one of a metal contact to an underlying semiconductor device, is on a source/drain of the underlying device, or is on an electrode of the underlying semiconductor device; and
a second interlayer dielectric around the top contact, around the sidewall spacer, around a portion of a side of the dielectric layer, and around a side of the ring of inner metal.

* * * * *